May 18, 1965 J. G. BADGER 3,183,726

TELEVISION TUNER

Filed Feb. 19, 1963 4 Sheets-Sheet 1

INVENTOR
JOE G. BADGER
BY Mason, Kolehmainen, Rathburn and Wyss
ATTORNEYS.

INVENTOR.
JOE G. BADGER
BY
Mason, Kolehmainen, Rathburn and Wyss
ATTORNEYS.

INVENTOR
JOE G. BADGER
BY Mason, Kolehmainen
Rathburn and Wyss
ATTORNEYS.

May 18, 1965 J. G. BADGER 3,183,726

TELEVISION TUNER

Filed Feb. 19, 1963 4 Sheets-Sheet 4

INVENTOR
JOE G. BADGER
BY Mason, Kolehmainen, Rathburn and Wyss
ATTORNEYS.

United States Patent Office 3,183,726
Patented May 18, 1965

3,183,726
TELEVISION TUNER

Joe G. Badger, Bloomington, Ind., assignor to Sarkes Tarzian Inc., Bloomington, Ind., a corporation of Indiana Filed Feb. 19, 1963, Ser. No. 259,528
15 Claims. (Cl. 74—10.8)

The present invention relates to television tuners, and, more particularly, to television tuners of the type which provide a so-called memory fine tuning arrangement for automatically providing a fine tuning adjustment for each individual television channel. In addition, the gear train arrangement employed in the memory fine tuning arrangement of the present invention has application in other fields such as power transmission, and the like.

Present-day television tuners of the rotary type include an incrementally rotatable channel selector shaft for selectively connecting certain ones of a plurality of tuned circuit elements into operative circuit relationship with other tuner elements for each of a plurality of channel selector positions. Because of the difficulty of accurately setting the values of the tuned circuit elements, and because of the desirability of accurately tuning the local oscillator for clear reception in each of the channel positions of the station selector shaft, it is customary to include an impedance device having an adjustable value in the oscillator circuit. This impedance device is conventionally adjusted by means of a vernier or fine tuning shaft, frequently concentrically mounted with respect to the channel selector shaft. The fine tuning shaft is connectable by the viewer to adjust the tuning impedance for each predetermined position of the selector shaft.

Various memory fine tuning arrangements have been proposed to maintain individual channel tuning adjustments once they have been established by the user without requiring adjustment of the fine tuning shaft of the tuner by the user each time a particular channel is selected. One such arrangement is described in my copending patent application Serial No. 121,210, filed June 30, 1961, and assigned to the same assignee as the present invention. The present fine tuning arrangement is particularly useful on turret type tuners, for example, the tuner illustrated in Krepps et al. application Serial No. 120,440, filed June 28, 1961, wherein individual coil assemblies are provided for each channel, these coil assemblies being removably mounted in a rotatable turret structure. As disclosed in this Kreeps et al. copending application, each coil assembly is provided with an oscillator coil, the inductance of which may be adjusted by means of an adjustable element or threaded slug which extends into an opening in the end of the coil assembly adjacent the oscillator coil. Since television tuners are made in large volumes, in order to be commercially competitive, it is desirable to provide a low cost engage and disengage fine tuning transmission mechanism with a minimum number of parts, which is compact in size and is movable into and out of engagement with any one of the coil supporting panels or sticks of the turret to provide memory fine tuning adjustments in the different channel positions of the channel selector shaft. Moreover, the fine tuning power transmission mechanism must be small in size, particularly narrow in depth, to permit installation of the tuner into small, compact television cabinets. Also, since the fine tuning shaft is offset laterally from the axis of the adjustment slugs in the individual coil panels, a mechanical arrangement is required to translate rotary motion of the fine tuning shaft into rotary motion of the adjustment slug while adding a minimum depth to the tuner. Furthermore, engagement with the adjustment slug must terminate automatically when the user releases the fine tuning shaft so that the turret is free to rotate to another channel position.

It is, therefore, an object of the present invention to provide a new and improved television tuner wherein an improved memory fine tuning arrangement is provided for automatically adjusting the fine tuning of the tuner in each channel selecting position of the station selector shaft.

Another object of the present invention is to provide a new and improved turret type television tuner employing individually adjustable tuning elements for each channel selecting position of the turret.

A further object of the present invention is to provide a new and improved memory fine tuning arrangement for a television tuner.

Another object of the present invention is to provide a new and improved turret type television tuner wherein the fine tuning in each of the channel selecting positions can be manually readjusted by manipulation of the fine tuning knob in the conventional manner.

A further object of the present invention is to provide an improved power transmission system employing meshed gears wherein the gear centers may be separated while permitting the separated gears to transmit power smoothly and efficiently.

Another object of the present invention is to provide a new and improved power transmission system employing meshed gears wherein the gear centers may be separated while substantially preventing cogging or jamming of the gear teeth.

A further object of the present invention is to provide a new and improved power transmission system wherein a gear train is provided having power transmitting capabilities similar to helical gears but without the end thrust produced in helical gear arrangements.

A still further object of the present invention is to provide a new and improved gear train for power transmission wherein spur gears having relatively large teeth may be employed while providing smooth and efficient transmission of power between gears without the production of end thrust on the power transmission shafts.

Briefly, in accordance with the present invention, a memory fine tuning mechanism is provided which utilizes a number of individually adjustable tuning elements which are rotatable with the channel selector shaft of the tuner. The fine tuning shaft of the tuner is concentric with the station selector shaft of the tuner and is releasably engageable with a selected one of these adjustable tuning elements by means of a gear train including a pair of gears. One of these gears has a frictional load continuously applied thereto so that when an attempt is made to rotate the other gear the loaded gear is forced away from the other gear and establishes engagement with one of the adjustable fine tuning elements of the tuner upon rotation of the other gear in the same direction, the tuning element may be adjusted in one direction. When the fine tuning shaft, to which the other gear is connected, is released, the loaded gear is spring biased to return to its initial position and engagement with the tuning element ceases. If it is desired to rotate the tuning element in the opposite direction, the tuning shaft is urged in the opposite direction which again forces the loaded gear outwardly into engagement with the tuning element which, upon further rotation of the shaft, may be adjusted in the opposite direction.

In accordance with a further feature of the present invention, the driving and loaded gears each comprise a pair of offset spur gears the teeth of which mesh with the teeth of the other pair in predetermined phase relationship. Such an arrangement permits separation of the gear centers to provide engagement and disengagement with individual tuning elements while at the same time providing smooth transmission of power between pairs of gears and without cogging or jamming of gear teeth.

In accordance with another aspect of the invention, an economical gear train is provided for power transmission systems, and the like, wherein each gear unit comprises a number of spur gears arranged in predetermined phase dis-placement on a common shaft. These gear units may employ spur gears having relatively large teeth for great power transmission and strength while reducing the cogging effect by virtue of the greatly increased number of active driving teeth. Such a great train approaches the smoothness of helical gears without the attendant thrust problems of the latter and without the expense of a herringbone gear. The gear units are easily fabricated and assembled since they may be formed of simple spur gears keyed or pinned in properly phased relationship to the input and output shafts and are of much lower cost than helical gears of similar power transmitting capabilities.

The invention, both as to its organization and method of operation, together with further objects and advantages thereof, will best be understood by reference to the following description, taken in conjunction with the accompanying drawings, in which.

Figures 1, 2, 3, 4, 5:
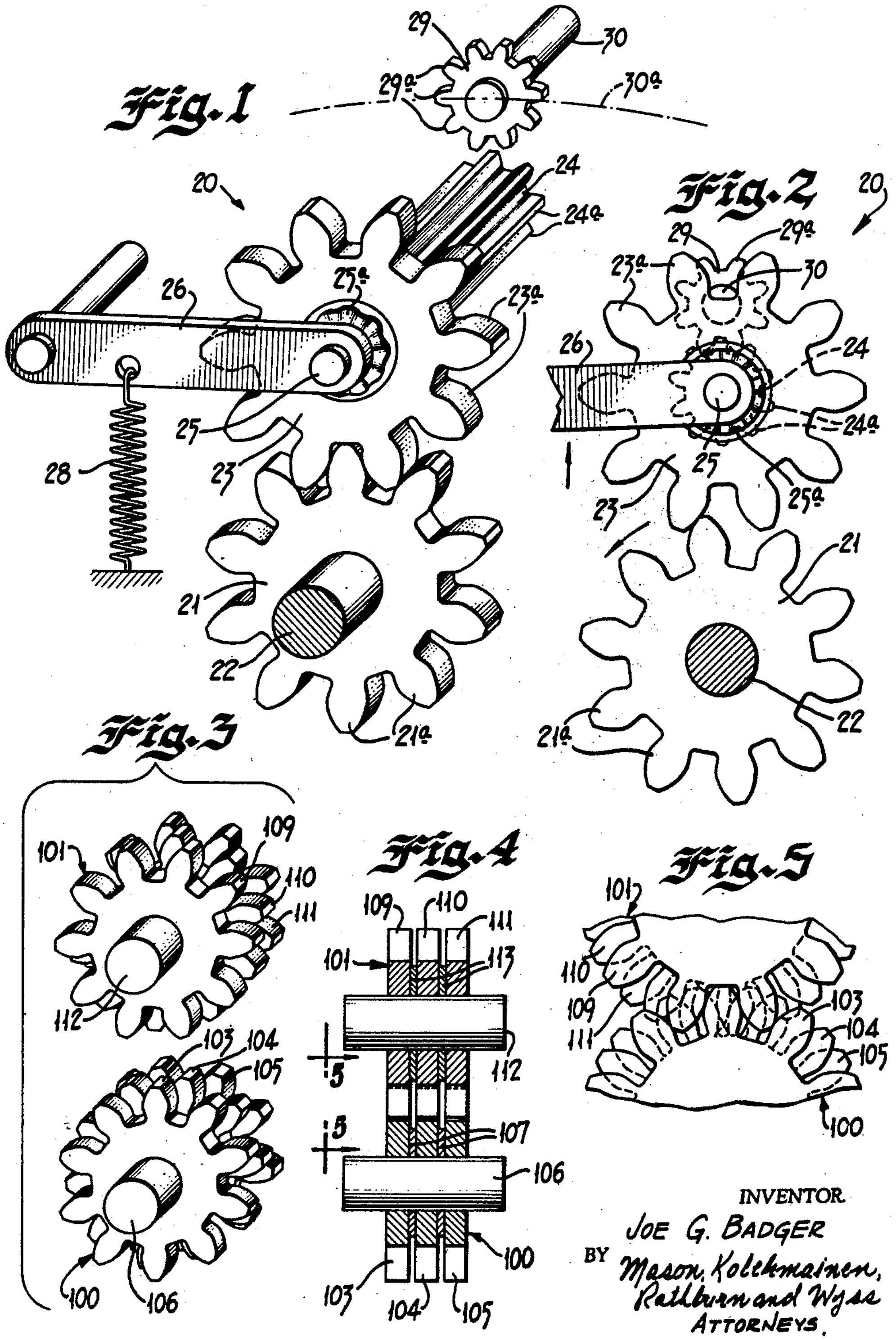
FIG. 1 is an isometric view of an engage-disengage gear train arrangement according to the present invention, illustrated in its disengaged position.
FIG. 2 is an elevational view of the gear train of FIG. 1, illustrated in its engaged position.
FIG. 3 is an isometric view of a gear train constituting a power transmission system according to another embodiment of the present invention.
FIG. 4 is a cross-sectional view of the power transmission system of FIG. 3.
FIG. 5 is a fragmentary elevational view of the gear train according to the embodiment of FIG. 3.

Referring now to the drawings, and particularly to the embodiment of FIGS. 1 and 2, there is illustrated an engage-disengage gear train arrangement 20 according to one embodiment of the present invention. The power transmission system includes a driving gear 21, here shown as a spur gear having teeth 21*a* and secured to a suitable driving shaft 22, which, in a television tuner, may comprise the fine tuning control shaft. The driving gear 21 drivingly engages or meshes with a gear 23, also shown as a spur gear to mesh with the driving gear 21, which need not be of the same pitch diameter, but which, as is known, must be of the same diametral pitch to provide corresponding teeth 23*a*. The gear 23 is rotatably mounted with a pinion 24 on an idler shaft 25 carried at one end of a pivotally mounted lever 26.

The lever 26 is pivotally mounted about a shaft 27 so that the gear 23 can move radially relative to the driving gear 21 and assume the positions illustrated in FIGS. 1 and 2. A tension spring 28 biases the lever 26 in a direction to bias the gears 21 and 23 relatively toward each other. The pinion 24 is provided with a plurality of teeth 24*a* of small diametral pitch compared to the diametral pitch of the gears 21 and 23. The pinion 24 is normally out of engagement, but is engageable with a pinion gear 29 mounted in suitable manner on a shaft 30, which, when applied to a television tuner, may constitute an adjustable tuning element of the tuner.

In accordance with an important feature of the present invention, the gear 23, while mounted for rotation on the idler shaft 25, has a substantial frictional load placed thereon which tends to prevent rotation of the gear 23 on the shaft 25. This frictional load may be established by any suitable means such as the spring washer 25*a* and must be overcome before the gear 23 can be rotated on the shaft 25. If the gear 23 were not frictionally loaded, rotation of the driving gear 21 would merely cause the gear 23 to rotate and the gears 24 and 29 would never engage. However, with a frictional load on the gear 23, when a rotational force is exerted on the gear 21 it is opposed by the load on the gear 23 with the result that the gear 23 is moved away from the gear 21 to the position shown in FIG. 2 due to the camming action of the gear teeth on the gears 21 and 23 as the frictional load on the gear 23 is encountered. As the gear 23 moves away from the gear 21 the gears 24 and 29 engage. If the rotational force on the gear 21 is now increased it may be made sufficiently large to overcome the frictional load on the gear 23 so that this gear may be rotated while the gears 21 and 23 are maintained in the separated position shown in FIG. 2, with the result that the independent gear shaft 30 is also rotated. However, the gear 29 may be rotated only so long as this large rotational force is exerted on the gear 21 to hold the gears 24 and 29 in engagement. This means that as soon as the rotational force on the gear 21 is removed the spring 28 returns the gear 23 to its initial position of FIG. 1 and the gear 29 is disengaged from the rest of the gear train. The diametral pitch of the teeth 29*a* on the pinion gear 29 must, of course, be the same as the diametral pitch of the teeth 24*a*. However, the teeth 24*a* and 29*a* are necessarily small as compared to the teeth 21*a* and 23*a* so that the pinion 24 and pinion gear 29 can move into and out of engagement while the gears 21 and 23 remain at least partially engaged as shown in FIG. 2.

From the foregoing, it will be appreciated that the engage-disengage gear train arrangement of FIGS. 1 and 2 may be employed to adjust a number of individual spur gears 29 if these gears 21, 23, and 24 are moved into positions immediately adjacent the gear 24, i.e., along the path 30*a* shown in FIG. 1. Accordingly, the gear train arrangement of FIGS. 1 and 2 is particularly suitable for the memory fine tuning function in a television tuner of the turret type wherein individual tuning elements are spaced about the periphery of the turret. Thus, the gear 21 may be mounted on the fine tuning shaft of a television tuner and the spur gears 29 may comprise the individual tuning elements for different television stations which are moved into juxtaposition with the gear 24 in different station selecting positions of the tuner. It will be understood that while it is necessary for the teeth of the gears 21 and 23 to be of greater depth than the teeth of the gears 24 and 29, so that the teeth 21*a* and 23*a* remain in mesh when the teeth 24*a* and 29*a* are out of mesh; the gears 21 and 23 may, and preferably are, considerably larger in diameter than the gears 24 and 29, commensurate with the space available on the tuner, so that a large number of teeth are available and the gears 21 and 23 operate smoothly without cogging or jamming. In other words, the gears 21 and 23, which are shown in FIGS. 1 and 2 as having a relatively small number of teeth, will in a practical embodiment be of larger diameter and have more teeth so that even when the gears are separated as indicated in FIG. 2 the tips of the gear teeth will mesh properly and will operate smoothly without cogging and jamming. It will also be understood that the engage-disengage gear train arrangement of FIGS. 1 and 2 may be employed in any other desired application where a number of individual gear elements may be individually adjusted from a common shaft.

If the arrangement of FIGS. 1 and 2 is employed in a television tuner, it is desirable to have the gears 21 and 23 as small as possible, particularly when the engage-disengage gear train must function with a relatively small turret. However, when the gears 21 and 23 are formed with only a few large teeth they may tend to cog or jam when forced apart to the position shown in FIG. 2. In order to resolve these conflicting requirements the arrangement shown in FIGS. 6 to 16, inclusive, may be employed wherein the gear train arrangement of FIGS. 1 and 2 is modified and is shown in conjunction with a turret type television tuner.

Referring to these figures, the television tuner 40 includes a rotatable turret 41 and a memory fine tuning portion 42. The tuner 40 comprises a substantially U-shaped chassis 43, only fragmentarily illustrated, having a front wall 44 and a top deck portion 45 on which are mounted tube sockets (not shown) and other components of the tuner. As described in the above-identified Krepps et al. application, individual coil supporting sticks 47 are provided for each channel, these coil assemblies being removably mounted in the rotatable turret structure 41. Each of the coil assemblies 47 includes an oscillator coil 49 as well as RF and mixer coils (not shown) it being understood that the coils on the particular coil assembly are selectively engaged with the contacts of a fixed stator bar 52 as the turret is rotated by a manually operable channel selector shaft 53 to different channel selecting positions. The oscillator coil 49 on each coil stick 47 is tuned by means of an adjustable element or threaded slug, 54, FIG. 13, which extends into the end of the coil assembly 47 to a point within the oscillator coil 49. A spring clip 55 frictionally engages the threaded slug 54 through a slot 56 in the coil assembly 47 thereby to form a mating thread for the threaded slug 54, and to prevent accidental movement of the threaded slug 54 due to vibration, rotation of the turret 41, and like disturbances. A stop 57 limits the outward movement of the adjustable elements 54. When the outer end of the adjustable element 54 strikes the stop 57 the clip is forced to skip to the next thread and thus prevents damage to the element 54 and the associated gear train.

In order to adjust the elements 54, each element is provided with a portion 60 which extends out of the end of the coil stick and carries a pinion gear 61 on the end thereof. It will be appreciated that the adjustable elements 54 are moved through a predetermined path as the turret structure 48 is rotated, similar to the path 30*a* in FIG. 1. The pinion gear 61 of any element may be selectively engaged in a manner described in more detail hereinafter to position the slug 54 with respect to the oscillator coil 49 and, hence, provide a fine or vernier tuning adjustment for the particular channel corresponding to the particular coil assembly which is being adjusted. It will be understood, of course, that rotation of each pinion gear 61 will be effective to vary the reactance of the associated oscillator coil 49.

In order to individually adjust the adjustable elements 54, there is provided the fine tuning portion 42 including a power transmission system 65 according to the present invention. As herein illustrated, the memory fine tuning portion 42 includes a fine tuning shaft 66 concentrically positioned for free rotation on the channel selector shaft 53. A C-washer 62 maintains the fine tuning shaft 66 assembled on the channel selector shaft 53, and an arcuate, U-shaped spring 63 resiliently holds the shaft 53 in place within the chassis 43 of the tuner 40 and grounds the shaft 53 to the front wall 44. It will be understood that both of the shafts 53 and 66 are arranged to have suitable knobs (not shown) attached thereto so that they may be independently manipulated by the user.

Figures 6, 7, 8:
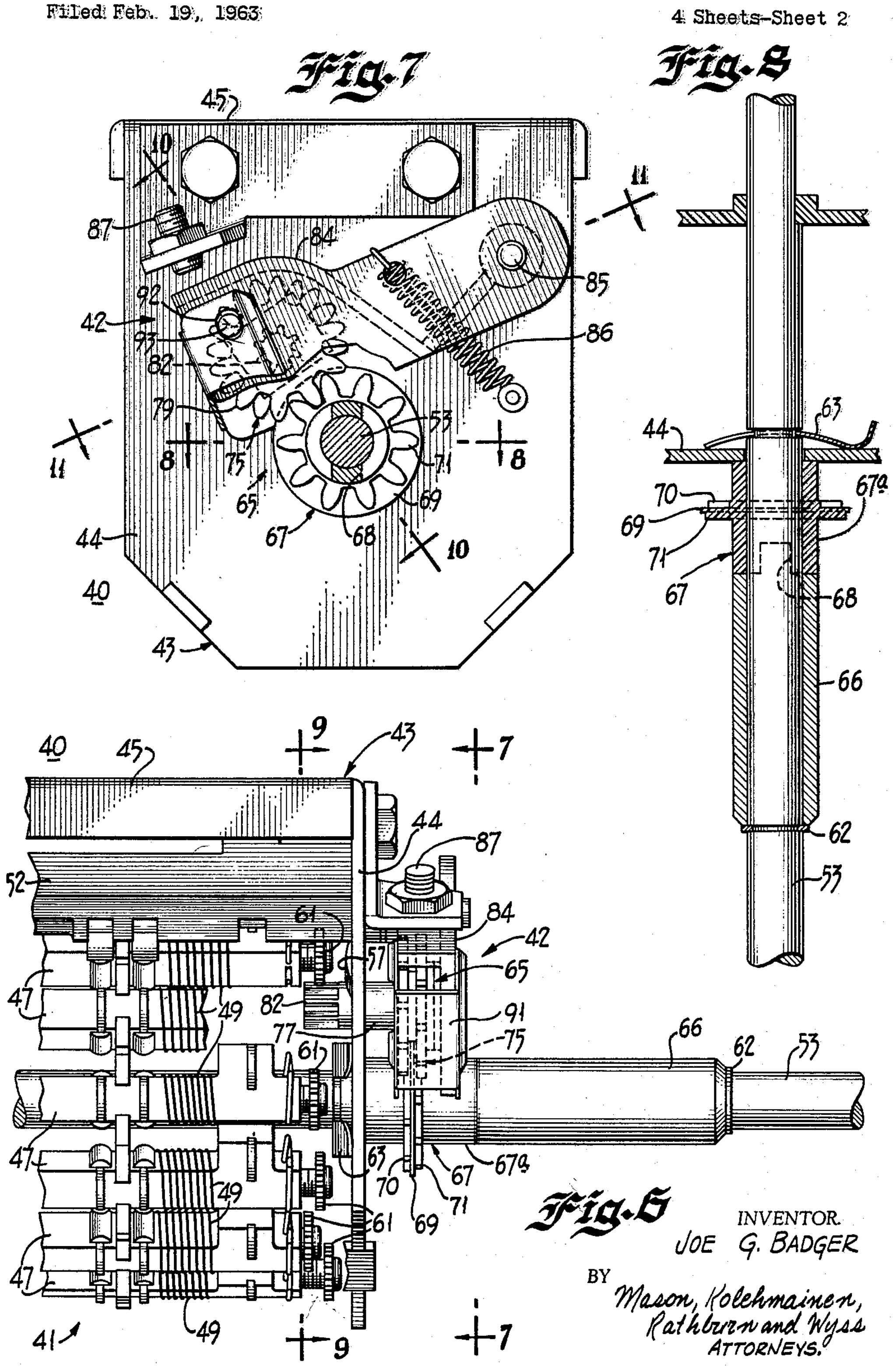
FIG. 6 is a side elevational view of a television tuner embodying an engage-disengage gear train arrangement generally similar to the embodiment of FIGS. 1 and 2.
FIG. 7 is a front sectional elevational view of the television tuner of FIG. 6, taken along lines 7—7 of FIG 6.
FIG. 8 is a fragmentary sectional view illustrating in detail the control shafts of the television tuner of FIG. 6, and taken along line 8—8 of FIG. 7.
Figure 9:
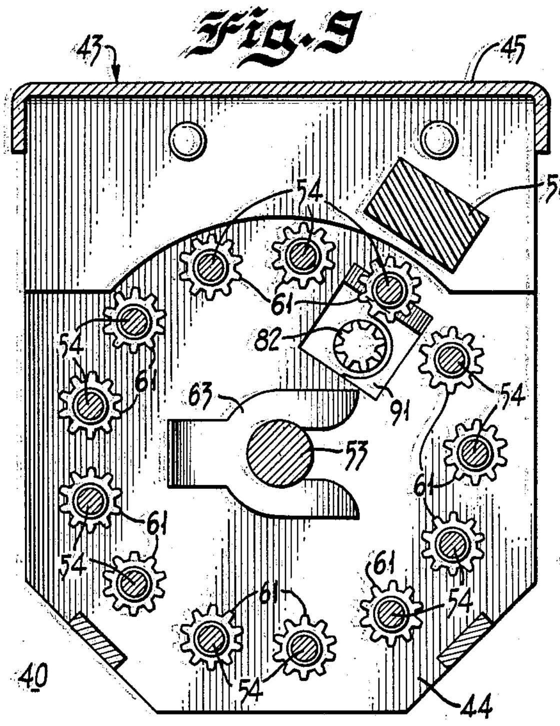
FIG. 9 is a sectional elevational view of the television tuner of FIG. 6, taken along line 9—9 of FIG. 6.
Figure 10:
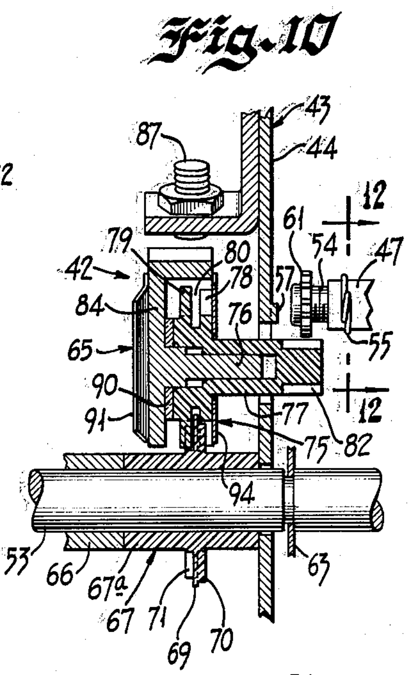
FIG. 10 is a fragmentary sectional elevational view of the television tuner of FIG. 6, taken along line 10—10 of FIG. 7.

The fine tuning shaft 66 drivingly engages the hub 67*a* of a first driving gear assembly 67 by means of the tongue and groove connection illustrated at 68 in FIG. 8. The driving gear assembly 67 includes a radially extending flange 69, best illustrated in FIGS. 14, 15, and 16, and a pair of substantially identical spur gears 70 and 71 are formed integrally on opposite sides of the flange 69. The flange 69 extends radially outwardly beyond the tips of the teeth of the gears 70 and 71 and the teeth of the gears 70 and 71 are offset relative to one another in predetermined phase relationship. This offset relationship is clearly shown in FIGS. 14 and 15 wherein the teeth 70 are shown in full lines and the teeth 71 in dotted lines.

The driving gear assembly 67 is in driving engagement with a second set of spur gears indicated as the gear assembly 75 which is pivotally mounted to rotate about the axis of an idler shaft 76 and includes a hub portion 77 having a pair of substantially identical spur gears 78 and 79 formed integrally on one end of the hub portion 77 and extending radially outwardly beyond the periphery thereof. The gears 78 and 79 are spaced apart so as to define a groove 80 therebetween. The teeth of the spur gears 78 and 79 are offset relative to each other in the same phase relationship as the spur gears 70 and 71 of the driving gear assembly 67. Moreover, the flange 69 of the assembly 67 is positioned within the groove 80 so as to maintain the desired axial position of the gear assemblies 67 and 75 while permitting separation of the gear centers, as described in detail hereinafter. The hub 77 includes a pinion 82 formed integrally in the other end thereof and normally out of engagement with, but engageable with, the pinion gears 61 formed on the adjustable threaded elements 54. Preferably, both of the gear assemblies 67 and 75 are each molded from a suitable plastic material to provide a low cost gear train which will operate smoothly and effectively. Also, by providing the interlocking connection 68 for the assembly 67, different lengths of fine tuning shafts may be used and the assembly 67 may be stocked as a common part for all tuners.

Figures 14, 15:
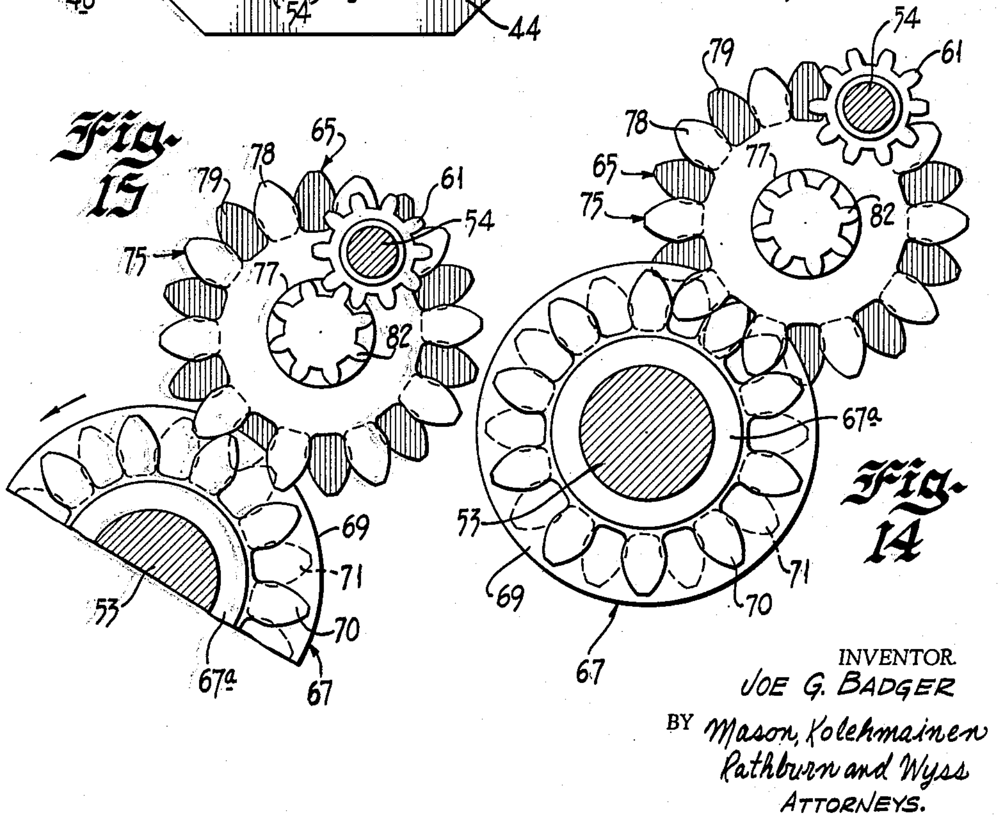
FIG. 14 is an elevational view of the gear train of the television tuner of FIG. 6, viewed from the rear of the tuner and illustrated in its disengaged position.
FIG. 15 is an elevational view of the gear train of FIG. 14, illustrated in its engaged position.

For selectively pivoting the pinion 82 into and out of driving engagement with different ones of the pinion gears 61, the idler shaft 76 is mounted on one end of a lever 84, the other end of the lever 84 being pivotally mounted to the front wall of the chassis 43 on the pivot pin 85. A tension spring 86 normally biases the lever 84 into a position urging the idler gear assembly 75 and the driving gear assembly 67 into fully meshed relation with each other, with the pinion 82 out of driving engagement with the pinion gears 61, as illustrated in FIG. 14. The lever 84 is pivotable to a second position wherein the gear assembly 75 and the driving gear assembly 67 have moved apart relative to each other but yet remain in driving engagement with each other, and at the same time the pinion 82 has moved from the disengaged position illustrated in FIG. 14 to an engaged position with a selected one of the pinion gears 61, as illustrated in FIG. 15. An adjustable stop screw 87 is positioned to engage the lever 84 and limit the radial movement of the gear assemblies 65 and 67 away from each other. The stop 87 is adjusted so that it is engaged by the lever 84 when the gears 61 and 82 are engaged to the point where their pitch circles touch in which position these gears mesh smoothly. If the stop 87 were not provided, sufficient force might be exerted radially outwardly to jam the gears 61 and 82 and damage the slug 54.

It will be appreciated that the gear teeth of the mating spur gears 70, 71 and 78, 79 are relatively long, the gears 70, 71, 78, and 79 having a relatively low diametral pitch. On the other hand, the gear teeth of the pinion 82 and the pinion gear 61 are relatively short in length, the pinion and pinion gear being of relatively high diametral pitch. In this manner the difference in tooth length will permit engagement and disengagement between the pinion 82 and the pinion gears 61 without disengagement between the gear assmbly 75 and the drivng gear assembly 67. The spur gears 70 and 71 and the spur gears 78 and 79 are identical to each other, but the respective stacks of spur gears forming the gear assembly 67 and the gear assembly 75 need not be the same size, except, of course, the identical diametral pitch must be maintained.

Figures 11, 12, 13, 16:
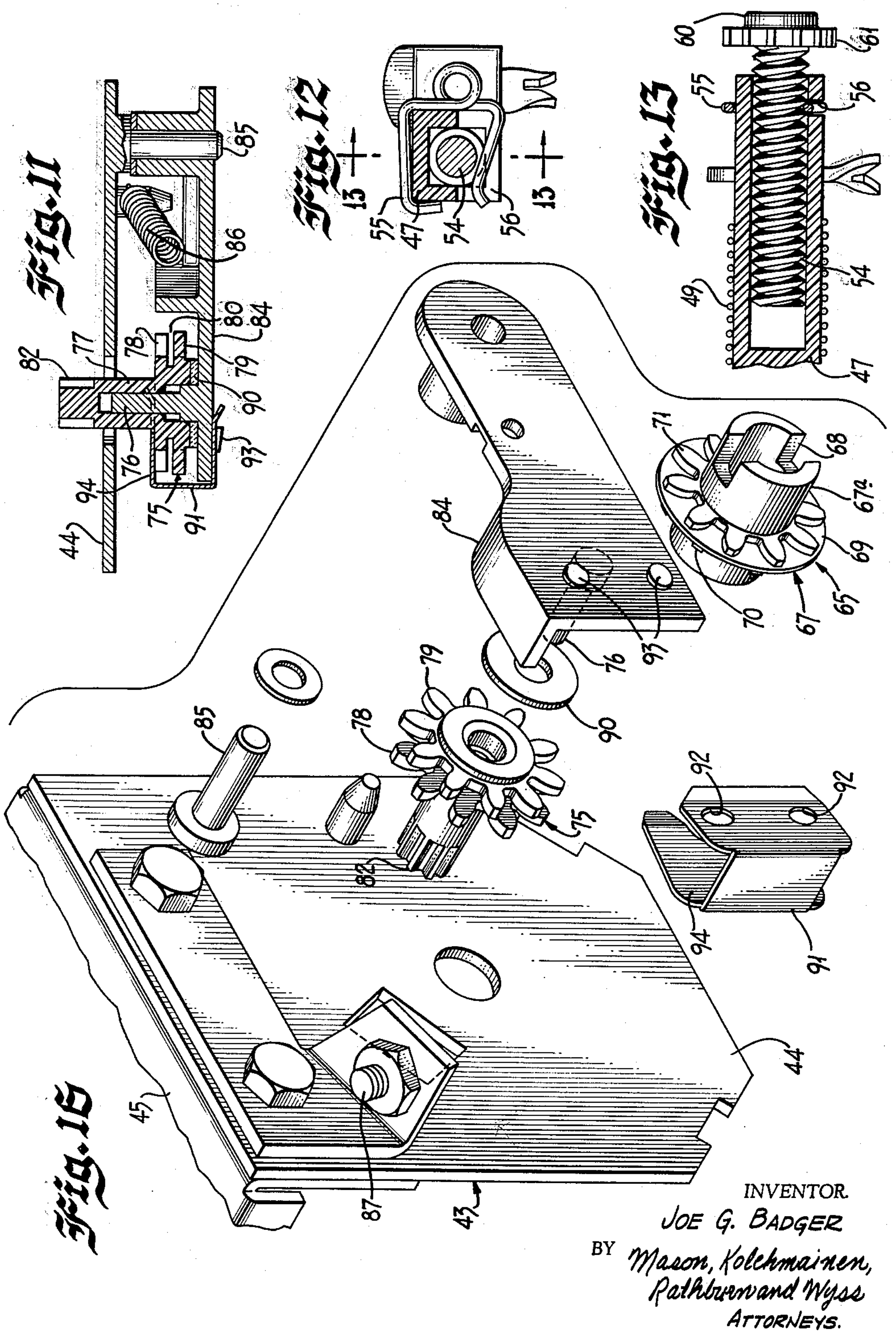
FIG. 11 is a fragmentary sectional view of the television tuner of FIG. 6, taken along line 11—11 of FIG. 7.
FIG. 12 is a fragmentary sectional view of the television tuner of FIG. 6, taken along line 12—12 of FIG. 7.
FIG. 13 is a fragmentary cross-sectional view of the television tuner of FIG. 6, taken along line 13—13 of FIG. 12.
FIG. 16 is a fragmentary exploded view illustrating certain details of the television tuner of FIG. 6.

In order to provide a predetermined frictional load on the gear assembly 75 so that this assembly cannot be rotated without forcing gear separation, a friction member 90 is interposed between the end of the assembly 75 and the vertical face of the lever 84, and a removable U-shaped spring clip 91 is positioned over the end of the lever 84 and clamps the assembly 75, the member 90 and the lever 84 together with a substantial force. The clip 91 is positioned by the holes 92 which engage bosses 93 in the lever 84 and the arm 94 of the clip is bifurcated to provide arms which engage the rear surface of the gear 78, as best illustrated in FIG. 11, in line with the axis of the assembly 75.

The force exerted by the clip 91 on the assembly 75 must be overcome before this assembly can be rotated. Accordingly, when a rotational force is exerted on the fine tuning shaft 66 this force is translated into movement of the assembly 75 away from the gear assembly 67 since the frictional load on the assembly 75 initially prevents this assembly from rotating and the engaged teeth of the assemblies 67 and 75 act as cam surfaces to move these assemblies apart. As the assemblies 67 and 75 are moved apart, the lever 84 pivots and the gears 61 and 82 are moved into engagement, as shown in FIG. 15. When the rotational force on the shaft 66 is increased sufficiently to cause slippage between the member 90, the assembly 75 and the lever 84, the assembly may be rotated while the gears 70, 71 and 78, 79 are in the position shown in FIG. 15 so that the gear 61 is rotated and the slug 54 is adjusted axially. The teeth of the spur 82 are of sufficient length to remain in engagement with the gear 61 throughout the the range of adjustment of the slug 54. However, when the inner face of the gear 61 strikes the end of the coil stick, the clip 55 (FIG. 13) jumps over the threads in the slug 54 to prevent damage to the slug and the driving gear train.

As soon as the rotational force is removed from the shaft 66 the gears 70, 71 and 78, 79 are no longer urged apart and the assemblies return to their initial positions of FIG. 14 due to the bias of the spring 86. If oppositely directed rotational force is exerted on the shaft 66 the assemblies 67 and 75 will again be forced apart and the gear 61 may be rotated in the opposite direction.

The operation of the improved television tuner, in accordance with the embodiment of FIGS. 6 through 16 will be readily understood, from the above-detailed description. However, briefly, the present invention includes the engage-disengage gear train system which interconnects the fine tuning control shaft of the television tuner and the individually adjustable elements, here shown as the threaded slugs 54 provided with the pinion gears 61. The gears 61 move through a predetermined path as the turret of the television tuner 40 is rotated and when a particular station is selected one of the gears 61 is positioned adjacent the spur 82. When it is desired to adjust the fine tuning of this station, initial rotation of the fine tuning shaft 66 in either direction is effective to apply an operative load on the mating gears of the gear assembly 75. The line of force between the driving gear assembly 67 and the gear assembly 75 is at an angle to the common tangent of the gears, with a tangential driving load being applied along the common tangent of the gear assemblies, and a radial component of the load being applied in a radial direction tending to move the gear assemblies 67 and 75 apart. Since the idler gear assembly 75 is frictionally restrained by pressure against the friction member 90, the load necessary to rotate the idler gear assembly 75 will produce a sufficient radial component to pivot the lever 84 and move the gear assemblies 67 and 75 apart, but yet maintain the teeth of the gears 70, 71 and 78, 79 in engagement, as best illustrated in FIG. 15. In this position the pinion 82 is moved into driving engagement with the pinion gear 61 of the adjustable element and continued rotation of the fine tuning shaft 66 is effective to adjust the position of the adjustable elements 54.

The memory fine tuning mechanism according to the present invention thus results in a low cost engage-disengage drive with a minimum number of parts and occupying a small space at the front of the television tuner. Moreover, by employing a plurality of gears arranged in phased relationship on a common shaft, the teeth of the gears 70, 71 and 78, 79 do not cog or jam when these gears are forced apart even though these teeth are relatively large and are spaced quite far apart, because as one set of teeth are about to disengage the other set is just starting to engage. Thus, in FIG. 15 as the teeth 70 and 78 are about to disengage the teeth 71 and 79 are just starting to engage. With this arrangement, the gear assemblies may be moved a substantial distance apart, to insure adequate clearance between the gears 61 and 82 in the disengage position of FIG. 14, while providing a smoothly operating gear train for adjusting the element 54 in the engage position of FIG. 15. This arrangement of staggered spur gears in the assemblies 67 and 75 provides a driving action approaching the smoothness of helical gears without the attendant thrust or cost problems involved therein. The gear assemblies 67 and 75 may be readily fabricated at low cost on a mass production basis. However, it will be understood that helical gears, or herringbone gears, could be utilized in place of the gears 70, 71 and 78, 79, if cost is not an overriding factor, and the same engage-disengage action may be achieved to provide memory fine tuning, as described above.

The staggered spur gear arrangement employed in the tuner of FIGS. 6 to 16, inclusive, may also be used as a power transmission assembly in applications other than use in a television tuner. For example, such an arrangement may be used in conventional power transmission units wherein helical gears are conventionally employed to transmit loads, such as automotive transmission units and the like. One such arrangement is shown in FIGS. 3 to 5, inclusive, wherein the input and output shafts 106 and 112 are mounted on fixed centers rather than being arranged to move apart as described in connection with the embodiments of FIGS. 1, 2, and 6 to 16. As illustrated in FIGS. 3 to 5, a pair of mating gear assemblies 100 and 101, either of which may be a driven gear assembly, and the other being a driving gear assembly, are provided. The gear assembly 100 is formed of a plurality, here shown as three, of identical spur gears 103, 104, and 105, spaced along the shaft 106 and axially separated by suitable spacers 107. The gears 103, 104 and 105 are offset relative to one another in a phased relation as shown in FIG. 5. Similarly, the mating gear assembly 101 is formed of the same number of identical spur gears 109, 110 and 111, all mounted in similar phase relationship as the gears 103, 104 and 105 on a common shaft 112 and separated by suitable spacers 113. Rotation of either of the gear assemblies 100 or 101 is effective to drive the other of the gear assemblies. With the spur gears in staggered relation, the teeth of each spur gear may be relatively large so that a large amount of power may be transmitted although the gears of the assemblies 100 and 101 are of relatively small diameter. Large teeth could not normally be used in gears of this diameter because the large spur gear teeth would tend to cog or jam. However, by staggering the gears a smooth and efficient transmission of power is provided since the number of active driving teeth is greatly increased and is distributed uniformly from one gear to the next. Furthermore, the smoothness of operation of the gear assemblies 100 and 101 approaches the performance of helical gears without producing end thrust on the assembly bearings as is the case with helical gears. It is also pointed out that the spur gear assemblies 100 and 101 may be economically and easily manufactured and assembled since low cost spur gears may be keyed or pinned to the shafts 106 and 112 in the proper phase relationship to provide each assembly. In this connection, the spacers 107 and 113 are provided to insure that the overlapping teeth of the individual gear sets 103, 109 and 104, 110, for example, have the necessary clearance in the axial direction. Alternatively, a flange and groove arrangement, such as the web 69 and groove 80 in the embodiment of FIGS. 6 to 16 may be used to maintain proper separation of the respective gear elements in each assembly. It is also pointed out that each of the assemblies 100 and 101 may be readily molded of suitable material since the gear teeth of each gear are relatively large and are of wide spacing. Accordingly, a very low cost transmission unit may be provided in those situations where a molded unit is satisfactory to transmit maximum power.

While certain preferred embodiments of the invention have been described by way of illustration, many modifications will occur to those skilled in the art. It will be understood, of course, that it is not desired that the invention be limited thereto, since modifications may be made, and it is, therefore, contemplated by the appended claims to cover any such modifications as fall within the true spirit and scope of the invention.

Having thus described the invention, what is claimed as new and desired to be secured by Letters Patent of the United States is:

1. In a television tuner of the turret type wherein a rotatable turret is provided which includes a plurality of circuit carrying elements corresponding to different television channels each having an adjustable tuning member, a fine tuning system for adjusting any one of said adjustable tuning members when said rotatable turret is in a predetermined position, comprising a fine tuning shaft, a pivotally mounted member, a first gear on said fine tuning shaft, a second gear on said pivotally mounted member, means exerting a force on said second gear which inhibits rotation thereof, whereby in response to a force exerted on said fine tuning shaft said pivotally mounted member is moved from a first position to a second position, and means carried by said pivotally mounted member and operative when said pivotally mounted member is in said second position to adjust the tuning member of a selected one of said circuit carrying elements, said last-named means being out of engagement with said tuning member when said pivotally mounted member is in said first position, thereby to permit rotation of said turret.

2. In a television tuner of the turret type wherein a rotatable turret is provided which includes a plurality of circuit carrying elements corresponding to different television channels each having an adjustable member for tuning the local oscillator of the tuner, a fine tuning system for adjusting any one of said adjustable tuning members when said rotatable turret is in a predetermined position, comprising a fine tuning shaft, a pivotally mounted member, a first gear on said fine tuning shaft, a second gear on said pivotally mounted member, means exerting a force on said second gear which inhibits rotation thereof, whereby in response to a force exerted on said fine tuning shaft said pivotally mounted member is moved from a first position to a second position, means carried by said pivotally mounted member and operative when said pivotally mounted member is in said second position to adjust the tuning member of a selected one of said circuit carrying elements, said last-named means being out of engagement with said tuning member when said pivotally mounted member is in said first position, and spring means normally urging said pivotally mounted member to said first position, thereby to permit rotation of said turret.

3. In a television tuner of the turret type wherein a rotatable turret is provided which includes a plurality of circuit carrying elements corresponding to different television channels each having an adjustable tuning member, a fine tuning system for adjusting any one of said adjustable tuning members when said rotatable turret is in a predetermined position, comprising a fine tuning shaft, a movably mounted member, a first gear on said fine tuning shaft, a second gear on said movably mounted member, means for placing a restraining load on said second gear so that the same can be rotated only by exertion of a substantial force thereon, whereby in response to rotation of said fine tuning shaft in either direction said movably mounted member is moved from a first position to a second position by the camming action of the teeth of said first gear upon the teeth of said loaded second gear, means carried by said movably mounted member and operative when said movably mounted member is in said second position to adjust the tuning member of a selected one of said circuit carrying elements, said last-named means being out of engagement with said tuning member when said movably mounted member is in said first position, thereby to permit rotation of said turret.

4. In a television tuner of the turret type wherein a rotatable turret is provided which includes a plurality of circuit carrying elements corresponding to different television channels each having an adjustable tuning member, said adjustable tuning members being moved through a predetermined path as said turret is rotated, a fine tuning system for adjusting any one of said adjustable tuning members when said rotatable turret is in a predetermined position, comprising a fine tuning shaft, a pivotally mounted member, a first gear on said fine tuning shaft, a second gear rotatably mounted on said pivotally mounted member, means for exerting a force on said second gear which impedes rotation thereof, whereby in response to rotation of said fine tuning shaft in either direction said first and second gears are moved apart while maintaining the tips of the teeth thereof in engagement, and means carried by said pivotally mounted member for adjusting the tuning member of a selected one of said circuit carrying elements while said first and second gears are spaced apart, said last-named means being positioned outside said path of said tuning members when said fine tuning shaft is released.

5. In a television tuner of the turret type wherein a rotatable turret is provided which includes a plurality of circuit carrying elements corresponding to different television channels each having an adjustable tuning member, a fine tuning system for adjusting any one of said adjustable tuning members when said rotatable turret is in a predetermined position, comprising a fine tuning shaft, a pivotally mounted member, a first gear on said fine tuning shaft, a second gear rotatably mounted on said pivotally mounted member, means normally biasing said pivotally mounted member to an initial position in which said first and second gears are substantially meshed, means for exerting a force on said second gear which impedes rotation thereof, whereby in response to rotation of said fine tuning shaft in either direction said first and second gears are moved apart, means carried by said pivotally mounted member for engaging a selected one of said tuning members when said first and second gears are moved apart and preventing further movement apart of said second gear so that the tips of the teeth of said first and second gears remain in engagement, whereby the selected tuning member may be adjusted by further rotation of said tuning shaft in the same direction, said engaging means being positioned out of engagement with said tuning members when said pivotally mounted member is in said initial position to permit rotation of said turret.

6. In a television tuner, a rotatable support carrying a plurality of individual adjustable members corresponding to different television channels, a fine tuning shaft, a pivotally mounted member, a first gear on said fine tuning shaft, a second gear rotatably mounted on said pivotally mounted member and in engagement with said first gear, means providing a load on said second gear which must be overcome to rotate same, whereby upon initial rotation of said fine tuning shaft said pivotally mounted member is moved from a first position to a second position by the action of said first gear on said loaded second gear, and means carried by said pivotally mounted member and operative when said pivotally mounted member is in said second position to adjust a selected one of said individually adjustable members.

7. In a television tuner, a rotatable support carrying a plurality of individually adjustable members corresponding to different television channels, a fine tuning shaft, a pivotally mounted member, a first pair of gears on said fine tuning shaft and said pivotally mounted member, means for placing a load on one of said first pair of gears which must be overcome to rotate the same, whereby upon initial rotation of said fine tuning shaft said pivotally mounted member is moved from a first position to a second position by the camming action of the engaged tooth portions of said first pair of gears, gear means carried by said pivotally mounted member and adapted to engage a selected one of said individually adjustable members only when said pivotally mounted member is in said second position, said gear means being out of engagement with said individually adjustable members when said pivotally mounted member is in said first position, thereby to permit rotation of said support without engagement of said gear means with individually adjustable members.

8. In a television tuner, a rotatable support carrying a plurality of individually adjustable members corresponding to different television channels, a fine tuning shaft, a pivotally mounted member, a first pair of gears on said fine tuning shaft, and said pivotally mounted member, means for exerting a force on one of said first pair of gears which must be overcome to rotate the same, whereby upon initial rotation of said fine tuning shaft in a predetermined direction said pivotally mounted member is moved from a first position to a second position by the camming action of the engaged tooth portions of said first pair of gears while maintaining the tips of the teeth of said first pair of gears in engagement, and gear means carried by said pivotally mounted member and driven by said first pair of gears, said gear means being adapted to engage a selected one of said individually adjustable members only when said pivotally mounted member is in said second position so that continued rotation of said fine tuning shaft in said predetermined direction after overcoming said force exerted on said one gear is effective to adjust said selected adjustable member.

9. In a television tuner, a rotatable support carrying a plurality of individually adjustable members corresponding to different television channels, a fine tuning shaft, a pivotally mounted member, a first pair of gears on said fine tuning shaft and said pivotally mounted member, means for placing a load on one of said first pairs of gears which impedes rotation thereof, whereby upon initial rotation of said fine tuning shaft in a predetermined direction said pivotally mounted member is moved from a first position to a second position by the camming action of the engaged tooth portions of said first pair of gears while maintaining the tips of the teeth of said first pair of gears in engagement, gear means carried by said pivotally mounted member and driven by said first pair of gears, said gear means being adapted to engage a selected one of said individually adjustable members only when said pivotally mounted member is in said second position so that continued rotation of said fine tuning shaft in said predetermined direction after overcoming said load on said one gear is effective to adjust said selected adjustable member, and means normally urging said pivotally mounted member to said first position.

10. In a television tuner, a rotatable support carrying a plurality of individually adjustable members corresponding to different television channels, a fine tuning shaft, a pivotally mounted member, a first pair of gears having relatively coarse teeth mounted respectively on said fine tuning shaft and said pivotally mounted member, means for loading one of said first pair of gears to impede rotation thereof, whereby upon initial rotation of said fine tuning shaft in a predetermined direction said pivotally mounted member is moved from a first position to a second position by the camming action of the engaged tooth portions of said first pair of gears while maintaining the tips of the teeth of said first pair of gears in engagement, gear means carried by said pivotally mounted member and driven by said first pair of gears, said gear means being adapted to engage a selected one of said individually adjustable members only when said pivotally mounted member is in said second position so that continued rotation of said fine tuning shaft in said predetermined direction upon overcoming said frictional load on said one gear is effective to adjust said selected adjustable member, said gear means having relatively fine teeth so that when said pivotally mounted member is in said first position said gear means is out of engagement with said individually adjustable members.

11. In a television tuner, a rotatable support carrying a plurality of individually adjustable members corresponding to different television channels, a fine tuning shaft, a pivotally mounted member, a first pair of gears adapted to rotate as a unit on said fine tuning shaft and having the teeth thereof in predetermined offset relation, a second pair of gears mounted for rotation as a unit on said pivotally mounted member and in engagement with said first pair of gears, means providing a load on said second pair of gears which must be overcome to rotate same, whereby upon initial rotation of said fine tuning shaft in a predetermined direction said pivotally mounted member is moved from a first position to a second position by the action of said first pair of gears on said loaded second pair of gears, and means carried by said pivotally mounted member and operative when said pivotally mounted member is in said second position to adjust a selected one of said individually adjustable members.

12. In a television tuner, a rotatable support carrying a plurality of individually adjustable members corresponding to different television channels, a fine tuning shaft, a pivotally mounted member, a first pair of gears adapted to rotate as a unit on said fine tuning shaft and having the teeth thereof in predetermined offset relation, a second pair of gears mounted for rotation as a unit on said pivotally mounted member and in engagement with said first pair of gears, means providing a load on said second pair of gears which must be overcome to rotate same, whereby upon initial rotation of said fine tuning shaft in a predetermined direction said pivotally mounted member is moved from a first position to a second position by the radial component of the force between said pairs of gears while maintaining said first pair of gears in engagement with said second pair of gears, and gear means carried by said pivotally mounted member and driven by said first and second pairs of gears, said gear means being adapted to engage a selected one of said individually adjustable member only when said pivotally mounted member is in said second position so that continued rotation of said fine tuning shaft in said predetermined direction is effective to adjust said selected adjustable member.

13. In a television tuner, a rotatable support carrying a plurality of individually adjustable members corresponding to different television channels, a fine tuning shaft, a pivotally mounted member, a first pair of gears adapted to rotate as a unit on said fine tuning shaft and having the teeth thereof in predetermined offset relation, a second pair of gears mounted for rotation as a unit on said pivotally mounted member and in engagement with said first pair of gears, means providing a load on said second pair of gears which must be overcome to rotate same, whereby upon initial rotation of said fine tuning shaft in a predetermined direction said pivotally mounted member is moved from a first position to a second position by the action of the radial component of force between said pairs of gears on said pivotally mounted member, and means normally urging said pivotally mounted member to said first position.

14. An apparatus for selectively adjusting any one of a plurality of individually adjustable elements, comprising a rotatable support carrying a plurality of individually adjustable members, a control shaft, a pivotally mounted member, a first gear on said control shaft, a second gear rotatably mounted on said pivotally mounted member, means for exerting a force on said second gear which must be overcome to rotate the same, whereby in response to rotation of said control shaft said pivotally mounted member is moved from a first position to a second position by the camming action of the teeth of said first gear upon the teeth of said second loaded gear, and means carried by said pivotally mounted member and operative when said pivotally mounted member is in said second position to adjust a selected one of said individually adjustable elements.

15. An apparatus for selectively adjusting any one of a plurality of individually adjustable elements, comprising a rotatable support carrying a plurality of individually adjustable members, a control shaft, a pivotally mounted member, a first gear on said control shaft, a second gear rotatably mounted on said pivotally mounted member, means normally biasing said pivotally mounted member to an initial position in which said first and second gears are substantially meshed, means for exerting a force on said second gear which impedes rotation thereof, whereby in response to rotation of said control shaft said first and second gears are moved apart while the tipes of the teeth thereof remain in engagement, and means carried by said pivotally mounted member and operative when said first and second gears have been moved apart to adjust a selected one of said individually adjustable elements, said pivotally mounted member being returned to said initial position by said biasing means upon release of said control shaft to permit rotation of said support.

References Cited by the Examiner

UNITED STATES PATENTS

| | | | |
|---|---|---|---|
| 232,586 | 9/80 | Worth | 74—466 |
| 638,194 | 11/99 | Arnold | 74—405 |
| 1,183,328 | 5/16 | Terry | 74—466 |
| 1,546,418 | 7/25 | Stresau | 74—466 |
| 2,862,400 | 12/58 | D'Angelo | 74—460 |
| 3,058,075 | 10/62 | Polley | 74—10.8 X |

BROUGHTON G. DURHAM, *Primary Examiner.*

MILTON KAUFMAN, *Examiner.*

UNITED STATES PATENT OFFICE

CERTIFICATE OF CORRECTION

Patent No. 3,183,726 May 18, 1965

Joe G. Badger

It is hereby certified that error appears in the above numbered patent requiring correction and that the said Letters Patent should read as corrected below.

Column 14, line 12, for "tipes" read -- tips --.

Signed and sealed this 8th day of February 1966.

(SEAL)
Attest:

ERNEST W. SWIDER
Attesting Officer

EDWARD J. BRENNER
Commissioner of Patents